METHOD OF MAKING AN ELECTRICAL TERMINAL BOARD ASSEMBLY

Filed Sept. 14, 1967

INVENTOR.
FRANK DEDEK

United States Patent Office 3,536,565

Patented Oct. 27, 1970

3,536,565

METHOD OF MAKING AN ELECTRICAL TERMINAL BOARD ASSEMBLY

Frank Dedek, Westland, Mich., assignor to Burroughs Corporation, Detroit, Mich., a corporation of Michigan Filed Sept. 14, 1967, Ser. No. 667,722
Int. Cl. B32b *31/00*
U.S. Cl. 156—293 7 Claims

ABSTRACT OF THE DISCLOSURE

A method of forming a terminal board assembly which comprises the steps of placing a thin apertured sheet of thermo-setting plastic material on a surface of an apertured board or substrate of electrical insulating material, the plastic sheet being positioned upon the board with its holes in registration with those of the board. Subsequently, the projecting portions or pins of electrical accessories or components are inserted into the holes of the assembly of both the board and the sheet. Thereafter, the assembly is subjected to a high temperature environment which first causes the plastic material of the sheet to flow into the annular spaces between the component pins and the walls of the holes into which they are inserted and then later causes this plastic material to polymerize or harden thereby firmly securing the pins and their associated components to the insulating board.

BACKGROUND OF THE INVENTION

The field of art to which the present invention pertains is directed to the permanent securement of accessory elements or components to electrical terminal boards. Typical prior art methods of securing electronic circuit components to such terminal boards are illustrated by the U.S. Pat. No. 2,683,839 to J. T. Beck and the U.S. Pat. No. 2,972,003 to N. L. Greenman et al. Both patents suggest methods of securing such components to terminal boards by using epoxy resin materials. The invention herein disclosed distinguishes from the cited patents in the following respects:

As to the Beck patent, a hardenable plastic member is disclosed having a resinous adhesive layer thereupon. After a plurality of holes are formed in the member, a thin sheet of metal is overlaid upon the adhesive surface of the member and secured thereby, following which a resilient punch member operates upon the metal sheet forcing it and some of the adhesive into the holes in the board. Thereafter, the board is subjected to heat, with the result that the metal sheet is bonded to the board, including those portions which are forced into the holes. The resinous adhesive material is cured during this heating operation forming the bonding medium between the metal sheet and the board.

As to the Greenman et al. patent, it shows in FIG. 7 an accessory element inserted into a preformed hole in a fibrous resin board. In one form of the disclosure in this patent, the board is provided with a resinous skin integrally formed on the exterior surfaces of the board and the walls of the holes therein which, when subjected to a relatively high temperature, causes the accessory element to be bonded to the board.

The invention disclosed herein employs a pre-apertured board and a separate dry, pre-apertured film or sheet of bonding material, such as epoxy resin. The holes formed in the epoxy sheet are registrable with those of the board and the sheet is mounted on the board in such registered condition. With the resin sheet in registration on the board, pins of accessory elements are inserted therethrough. Subsequently, the assembly is subjected to a relatively high temperature environment which causes the epoxy material of the overlying sheet to flow into the holes and particularly into the annular spaces between the pins and the walls of the holes. Upon further application of this heat, the epoxy material of the sheet hardens and forms a permanent bond between the pins and the board.

In arriving at the method of this invention, several ways of accomplishing the desired bonding action were attempted including spraying or brushing the mounting board with thermosetting plastic material or subjecting the board to a dipping operation in a solution of such material. Spraying was found not to be satisfactory since the spray normally will not enter the pre-punched holes. Brushing was not practical since it leaves an uneven deposit and there is a hazard that too much bonding material will be left in some holes and will be picked up when the pins are inserted in the dry stage. In such circumstances the bonding material will melt during each curing cycle and cover the hole and pin with insulating material that is nearly invisible to the eye. Dipping results in a lack of uniformity of the bonding material deposits, either resulting in loose pins or pins picking up excess material and thereby acquiring an insulative coating.

SUMMARY OF THE INVENTION

The invention is directed to a method of making a terminal board assembly which comprises the steps of placing an epoxy resin impregnated sheet upon the surface of a substrate in the form of a phenolic board, the sheet and board each having apertures therein and being so located that when the sheet is placed upon the board, the apertures of both are in registry. Contact pins are then inserted through both sheet and board. The assembly is then subjected to a high temperature environment which causes the epoxy resin to flow into the annular spaces between the pins and the walls of the holes in the board. Further application of heat causes the bonding material to harden or polymerize causing a permanent bond to form between the contact pins and the phenolic board.

The object of this invention is to provide an improved method of bonding electronic accessories to a terminal board.

It is another object of the present invention to provide an improved method of bonding circuit elements to a terminal board, the method enabling mass production manufacture and at considerable reduction in cost.

It is the further object of this invention to utilize a pre-apertured epoxy resin impregnated sheet as the bonding material.

The above listed objects and other aspects of the invention will be further explained in the following detailed description. For a more complete understanding of the invention reference may be had to the following detailed description in conjunction with the drawings.

DESCRIPTION OF THE PREFERRED EMBODIMENT

Figure 1:
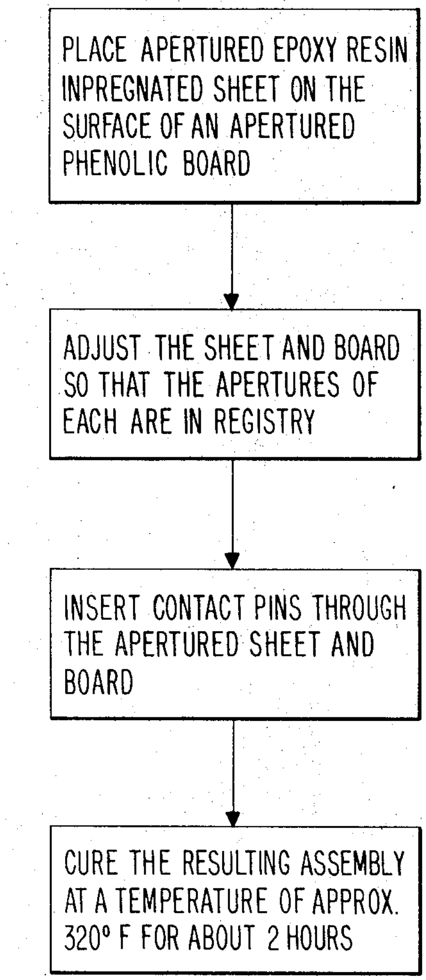
FIG. 1 is a flow chart depicting the process for manufacturing the terminal board assembly in accordance with the invention.

Referring to FIG. 1, the flow chart depicts the method of manufacturing the terminal board assembly of the present invention. An epoxy resin impregnated sheet, with a matrix of preformed holes thereupon, is placed upon the surface of an apertured mounting panel or board. The matrix of holes is so located on the sheet that when it is properly placed upon the board, the holes of the sheet and board are in registry. Contact pins are then inserted through the holes of both the sheet and the board. A pressure plate can be used at this point to press the sheet against the phenolic board. The assembly is then cured in an oven at approximately 320° F. for a period of two hours. This latter step causes the epoxy resin to flow into the annular spaces between the contact pins and the holes in the board and then to harden, which causes the contact pins to be firmly bonded and anchored to the phenolic board. The assembly is then withdrawn from the oven and the pressure plate removed.

Figure 2:
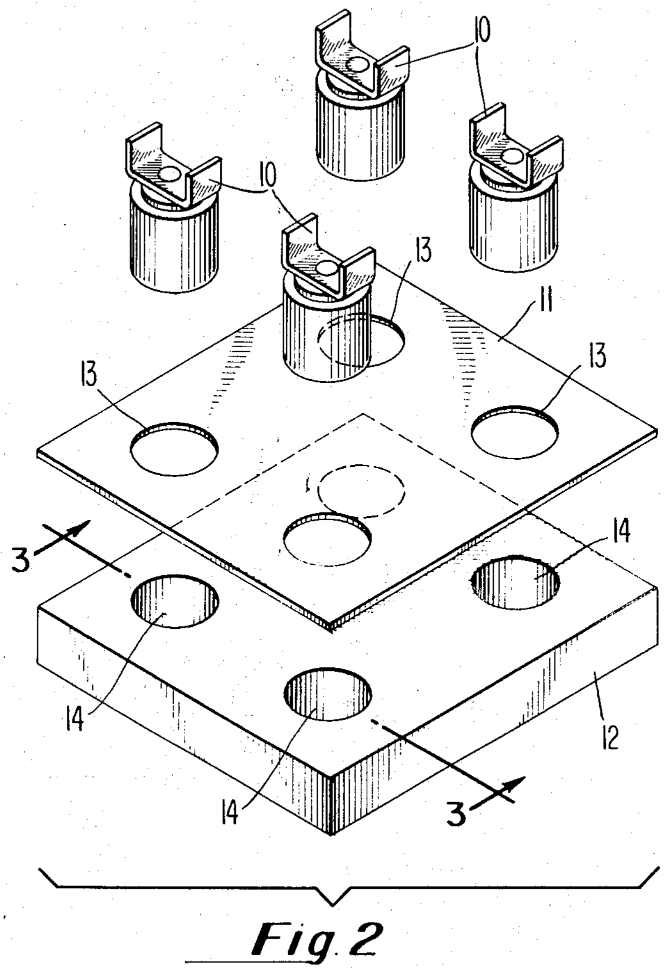
FIG. 2 is an exploded view of the components of a terminal board assembly according to the invention.

Referring now to FIG. 2 which shows the process of FIG. 1 in more detail, an exploded assembly shows contact pins 10, and a thin epoxy resin impregnated sheet 11 and a thicker phenolic board 12 each having holes 13 and 14 respectively.

The sheet 11 preferably consists of an epoxy resin with a paper base, although sheets of other thermo-setting and base materials may be used. The sheet 11 is also preferably in the partially cured condition, the sheet being dry and solid. The sheet 11 may vary in thickness from approximately .003 to .020 inch. The amount of bonding material to be used can be controlled by adjusting the thickness of the sheet. An epoxy resin impregnated sheet having a paper base which may be used to practice the invention is the Filmex 802 Series, which is manufactured by the Mansol Ceramics Co. of Belleville, N.J. This epoxy resin sheet with its paper base was selected so that the curing cycle would occur at 320° F. for a period of two hours. The sheet 11 has a matrix of holes 13 therein, the holes being arranged to correspond with the matrix of holes 14 which are formed on the phenolic board 12. The phenolic board 12 is to be used as the mounting board for the contact pins 10 which are inserted through the sheet 11.

The epoxy resin impregnated sheet 11 is placed upon the phenolic board 12 in a manner such that holes 13 and 14 are in registry with each other. The contact pins 10, which may be of brass, are then inserted through both sheet 11 and board 12. Though not shown in FIG. 2, a pressure plate may be used to apply uniform pressure to compress the sheet 11 and the phenolic board 12 together. The assembly is then subjected to a high temperature environment at 320° F. for a period of 2 hours. Initially the epoxy resin will flow into the annular space between the contact pins and the walls of the holes 14. As the assembly is further cured in this temperature environment, the epoxy resin will harden and make a permanent bond between the contact pins 10 and the board 12. The heat environment does not affect the phenolic board 12 as its curing temperature is established at a higher level such as approximately 375° F. Any paper base residue 16 will usually remain on the surface of the phenolic board 12 and may be left thereon if so desired. If the pressure plate is employed, it is preferred that it will have a Teflon coating in order to prevent the epoxy resin from adhering to the pressure plate surface.

Figure 3:
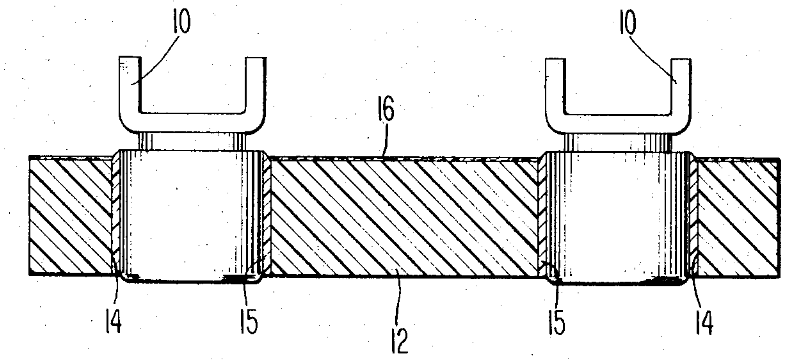
FIG. 3 is a detail sectional view taken along line 3—3 of FIG. 2 showing the final assembly of the terminal board formed in accordance with this invention.

Referring now to FIG. 3, there is shown a sectional view through the terminal board assembly after the process described in connection with FIGS. 1 and 2 has been completed. The contact pins 10 are shown bonded to board 12 by means of the epoxy resin 15, which first flowed into the annular space between the pins and the walls of the holes 14 and was then polymerized. By proper selection of the composition and thickness of sheet 11, nearly all of the epoxy resin flows into the annular spaces, leaving the sheet base as residue 16 on the surface of the board 12.

The superimposition of a separate dry thin sheet of perforated bonding material 11 upon the mounting board in registration with the holes in the board 12 enables the pins or other fastening elements to be simultaneously inserted in place in the board and secured or anchored therein in one heat treating operation. The bonding material represented by the sheet 11, which provides the eventual adhesive fastening, is completely dry at the time the pins are inserted into the board. This avoids the problem earlier mentioned herein of accidentally introducing bonding material into the holes before the pins are inserted and thereby resulting in the formation of an insulative film on parts of the pins when the assembly is subjected to curing temperatures. In the process described herein, none of the bonding material enters the holes before the pins are inserted. However, during the heat treatment at temperatures above the curing temperature of the bonding material of the sheet but below the polymerization temperature of the mounting board, the sheet material will flow on the upper surface of the board and enter the holes. Upon continued application of heat at this temperature level the material will harden and bond the pins to the board. This considerably shortens the time and reduces the cost of mounting accessory elements and components in printed circuit panel boards.

It is to be understood that the foregoing explanation is by way of illustration only. As would be evident to those skilled in the art the invention may be adapted to utilize impregnated sheets of various shapes and compositions of plastic, to bond other types of electrical components to the phenolic board, and to vary the curing temperatures and times.

What is claimed is:

1. A method of making an electrical assembly which comprises the steps of:

providing a board with a pattern of holes therein, providing an impregnated sheet with a like pattern of holes therein, said sheet including a thermosetting plastic material, placing the sheet on the surface of the board with the holes in the impregnated sheet in registry with the holes in the board, inserting electrical component mounting elements through the registered holes of the sheet and the board, subjecting the resulting assembly to a high temperature environment to cause the thermosetting plastic material to flow into the spaces between the peripheries of the electrical component mounting elements and the walls of the holes in the board, and embedding said mounting elements in said board by further heating the resulting assembly to harden the thermoplastic material.

2. A method of making a terminal board assembly which comprises the steps of:

providing a mounting board with a plurality of holes therein, providing a sheet with a like plurality of holes therein; said sheet including a partially cured epoxy resin, placing said sheet upon the surface of the board with the holes in the sheet in registry with the holes in the board, inserting contact pins through the registered holes in the sheet and in the board, liquifying the epoxy resin of the sheet by subjecting the resulting assembly to a heat environment causing the epoxy resin to flow into the annular spaces between the peripheries of the pins and the walls of the holes in the board, and subjecting the assembly to further heat to harden the epoxy resin and anchor the pins to the board.

3. The method as defined in claim 2 wherein the heat environment is maintained at approximately 320° F. for about two hours.

4. The method as defined in claim 2 including the step of applying pressure to the sheet to compress the sheet against the board.

5. A method of making an electrical assembly comprising the steps of:

overlaying a dry sheet formed at least in part of thermosetting material and having a plurality of apertures therein upon the surface of a mounting board formed at least in part of thermosetting material and likewise having a like plurality of apertures therein with apertures of the sheet in registry with apertures of the board, said thermosetting material of the sheet having a setting temperature below that of the thermosetting material of the board, inserting electrical component mounting elements through registered apertures of the sheet and board, subjecting the resulting assembly to a heat environment which is above the thermosetting temperature of the sheet but below that of the board for a period of time sufficient to cause the thermosetting material of the sheet to liquify and flow into the spaces between the component mounting elements and the walls of the apertures of the board, and anchoring the mounting elements in the board by subjecting the resulting assembly to said heat environment for a period of time sufficient to cause the thermosetting material of the sheet which has flowed into the apertures of the board to take a permanent set to thereby bond the component elements.

6. An article of manufacture prepared in accordance with the method of claim 7.

7. In a method for making a terminal board assembly wherein a thin dry sheet formed substantially of thermosetting material overlays the surface of a mounting board formed at least in part of thermosetting material, said thermosetting material of the sheet having a setting temperature below that of the thermosetting material of the board and wherein a plurality of electrical component mounting elements have been inserted through the sheet and the board, the steps of:

liquifying the thermosetting material of the sheet by subjecting the resulting assembly to a heat environment above the thermosetting temperature of the sheet but below that of the board for a period of time sufficient to cause the thermosetting material of the sheet to flow into spaces between the peripheries of the component mounting elements and surfaces of the board juxtaposed thereto, and anchoring the pins to the board by continuing the subjection of the resulting assembly to said heat environment for a period of time sufficient to cause the liquified thermosetting material to take a permanent set.

References Cited

UNITED STATES PATENTS

| | | | |
|---|---|---|---|
| 2,524,842 | 10/1950 | Slamon et al. | 156—293 |
| 2,748,047 | 5/1956 | Kuss | 156—293 |

REUBEN EPSTEIN, Primary Examiner

U.S. Cl. X.R.

29—630; 174—68.5